US006728103B1

(12) United States Patent
Smedberg

(10) Patent No.: US 6,728,103 B1
(45) Date of Patent: Apr. 27, 2004

(54) HEAT SINK WITH A CUTOUT

(75) Inventor: Darin P. Smedberg, Petaluma, CA (US)

(73) Assignee: Calix Networks, Inc., Petaluma, CA (US)

( * ) Notice: Subject to any disclaimer, the term of this patent is extended or adjusted under 35 U.S.C. 154(b) by 0 days.

(21) Appl. No.: 10/071,968

(22) Filed: Feb. 5, 2002

(51) Int. Cl.[7] ................................................ H05K 7/20
(52) U.S. Cl. ..................... 361/703; 29/890.03; 24/458; 257/719; 361/719
(58) Field of Search ....................... 29/890.03; 438/117; 403/408.1; 248/505, 510; 24/453, 457, 458, 624; 174/16.3; 165/80.3, 185; 257/718, 719, 722, 726, 727; 361/687, 703, 704, 709–712, 717–719

(56) References Cited

U.S. PATENT DOCUMENTS

| | | | | |
|---|---|---|---|---|
| 5,130,888 A | * | 7/1992 | Moore | 361/717 |
| 5,276,585 A | | 1/1994 | Smithers | 361/704 |
| 5,513,073 A | | 4/1996 | Block et al. | 361/719 |
| 6,061,239 A | * | 5/2000 | Blomquist | 361/704 |
| 6,093,961 A | * | 7/2000 | McCullough | 257/718 |
| 6,153,932 A | * | 11/2000 | Liang | 257/712 |
| 6,219,239 B1 | * | 4/2001 | Mellberg et al. | 361/704 |
| 6,325,552 B1 | | 12/2001 | Brillhart | 385/88 |
| 6,397,941 B1 | * | 6/2002 | McCullough | 165/185 |
| 6,424,530 B1 | | 7/2002 | Lee et al. | |
| 6,508,595 B1 | | 1/2003 | Chan et al. | 385/92 |

OTHER PUBLICATIONS

PG pub., US 2002/0108744 A1, Bowman, filed Apr. 19, 202, pub. Aug. 15, 2002.*

* cited by examiner

*Primary Examiner*—G. Tolin
(74) *Attorney, Agent, or Firm*—Silicon Valley Patent Group LLP

(57) ABSTRACT

A heat sink extends beyond the outer boundaries of a component cooled by the heat sink. In one embodiment, the heat sink may have a cutout shaped and located so that a protruding portion of a clip can extend through the cutout from one surface of the heat sink and mechanically fasten the component to another surface of the heat sink. There may be more than one cutout. Heat transfer values can be optimized by adjusting the number and the location of the cutouts and the size of the heat sink relative to the component and the fastening mechanism (e.g., a clip). In another embodiment, the clip that extends through the cutout holds the heat sink against a motherboard, pressing against a component located between the heat sink and the motherboard.

35 Claims, 16 Drawing Sheets

HEAT SINK WITH A CUTOUT

CROSS-REFERENCE TO RELATED APPLICATION

This application is related to, and incorporates by reference herein in its entirety, U.S. patent application Ser. No. 10/072,598, attorney docket No. entitled "A Fiber Guide Connected To A Heatsink Fastener", filed concurrently herewith by Matthew K. Meeker.

BACKGROUND

1. Field of the Invention

This invention relates generally to chip packaging and particularly to chip packaging including a heat sink.

2. Related Art

An electronic component (e.g., a Central Processing Unit) may generate a significant amount of heat when operating. If not dissipated in time, this heat can degrade performance of the component. To dissipate some of the generated heat, a heat sink device is commonly placed in contact with the component. The heat sink device usually includes a plate and several protrusions from the plate that increase the heat transfer surface area. Sometimes, a fan is used in addition to the heat sink device to assist in heat dissipation.

Currently, a number of methods are used to fasten the heat sink device to the component. FIG. 1 depicts an exemplary clip 10 disclosed in U.S. Pat. No. 6,153,932, which is incorporated by reference herein. Clip 10 includes a rectangular frame 12 with a hole 14. Rectangular frame 12 has protruding portions that are designed to extend through a hole, such as side plates 16 and protruding rods 20. Side plates 16 include a first side plate 16a connected to one part of rectangular frame 12 and a second side plate 16b connected to a different part of rectangular frame 12. Each of side plates 16a and 16b may have fastening hooks 18a and 18b, respectively. Side plates 16a and 16b press against two outer edges of a heat sink and a component, and fastening hooks 18a and 18b snap onto the bottom edges of the component. Protruding rods 20 may include a first protruding rod 20a and a second protruding rod 20b connected to the sides of frame 10 that do not have a side plate. Clip 10 may also have elastic rods 22 protruding from the inner side walls of frame 10 into hole 14 to provide extra stability and attachment to a heat sink. A person of ordinary skill in the art would understand that other structures for clip 10 are possible. For example, frame 12 and hole 14 may be of any other polygonal shape or even a circular shape. Furthermore, clip 10 may include any fastening device, such as a screw or a snap feature, that can be used to hold a heat sink in a fixed position relative to a component.

However, the currently used methods usually impose at least one limitation on the design of the motherboard or the heat sink. For example, while a screw allows flexibility in the dimensions of the heat sink, it requires that the motherboard have holes. A clip of the sort shown in FIG. 1 does not require that a motherboard have holes, but requires that heat sink and the component have a width substantially equal to the width of the clip. Such limitations compromise design optimization of heat sink devices.

A heat sink device that provides flexibility in terms of both the size of the heat sink and the motherboard circuitry design is needed.

SUMMARY

In accordance with the present invention, a heat sink extends beyond all outer boundaries of a component cooled by the heat sink. Such an oversized heat sink allows better optimization of heat transfer values than a conventional heat sink, which usually has at least one dimension (e.g. width as noted above) the same as or substantially equal to the corresponding dimension of the component to be cooled. An oversized heat sink attached by a clip to an electronic component not only allows better optimization of heat transfer values but also provides greater flexibility for motherboard circuitry design than a conventional heat sink.

In one embodiment, the heat sink has at least one cutout (or hole) shaped and located so that a portion (hereinafter "protruding portion") of a clip can extend from one surface of the heat sink and mechanically fasten the electronic component to another (eg., the opposite) surface of the heat sink. The cutout (or hole) may be shaped to fit around the protruding portion. For example, if the protruding portion is a flat plate, the cutout (or hole) through which the protruding portion is inserted may be a rectangular slit. If the protruding portion is a rod, the cutout (or hole) may be circular-shaped. The clip may fasten the heat sink to the component by the protruding portion snapping onto one or more edges of the component. When the clip fastens the heat sink to the component, no hole is needed in the motherboard. In an alternative embodiment, the clip may fasten a component to a heat sink by two or more protruding portions attaching to a motherboard and sandwiching the component between the heat sink and the motherboard. In this alternative embodiment, protruding portions of the clip extend not only through a cutout in the heat sink but also through a cutout in the motherboard, and each snaps onto an edge of the hole in the motherboard.

The clip may include a polygonal (e.g., rectangular) frame with a hole in the middle and a protruding portion on each side of the polygonal frame. Since cutouts (or holes) can be located anywhere on the heat sink, such cutouts (or holes) provide flexibility in terms of the size of the heat sink that can be used with a standard sized clip, and the location on the heat sink where the component is fastened. For example, locating cutouts away from the edges of the heat sink results in a component being fastened near the center of a heat sink. In some embodiments the heat sink extends beyond all outer boundaries of the component, although this is not required in other embodiments.

DETAILED DESCRIPTION

Figure 2:
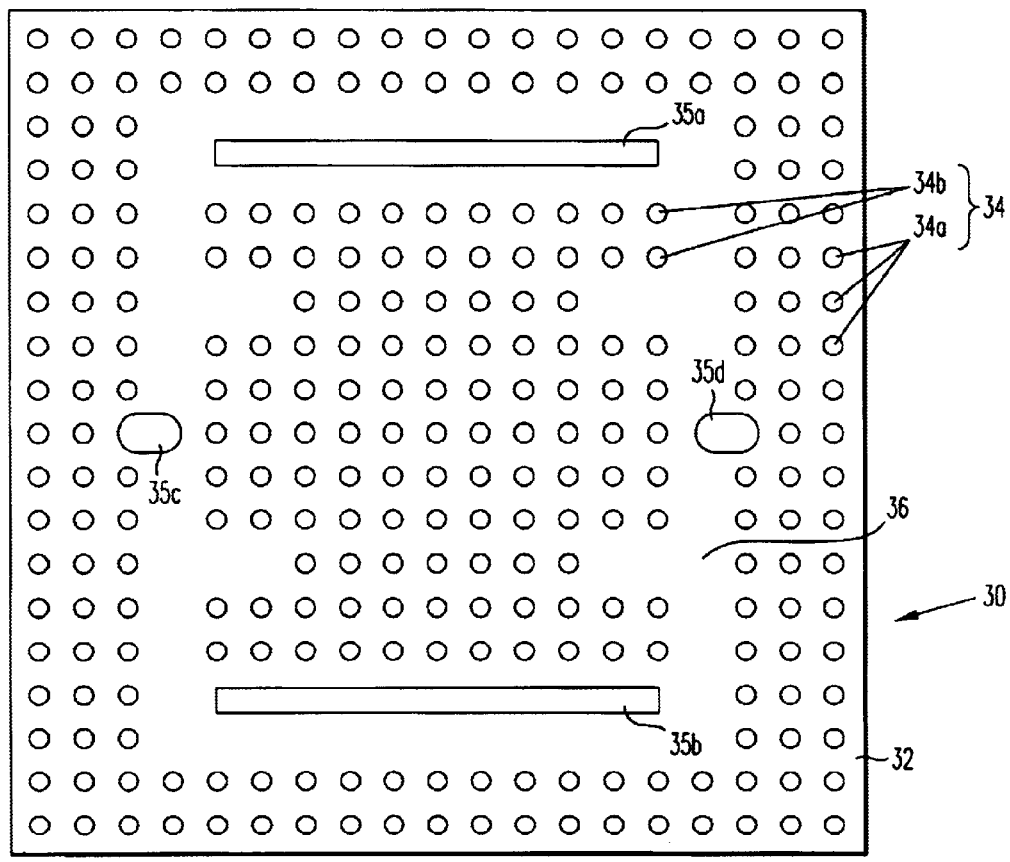
FIG. 2 illustrates a plan view of a heat sink in one embodiment of the present invention.

FIG. 2 depicts a view of a heat sink 30 in accordance with one embodiment of the present invention. Heat sink 30 includes a plate 32 that is larger in area than the area covered by an electronic component that is to be cooled by heat sink 30. In the embodiment illustrated in FIG. 2, the electronic component as well as plate 32 are rectangular in shape (e.g. square shape) although other shapes may be used in other embodiments (e.g. both could be circular or one circular and the other square). Plate 32 (FIG. 2) is large enough for peripheral portions of plate 32 to extend beyond and overhang the electronic component on all four sides. Overhanging the electronic component on all sides ensures a substantially even heat distribution from the electronic component into the heat sink. Therefore, the electronic component is cooled more uniformly by heat sink 30 (in all directions) and also to a greater amount (due to larger area) than a heat sink of the prior art, e.g. U.S. Pat. No. 6,153,932. The amount of overhand depends on the specific application needs, and can be chosen to be any amount depending on the available space and the heat generated by the electronic component. In one example, the width of a peripheral portion of plate 32 is 25% of the width of the electronic component, although overhang as great as 50% may be used in other examples, and as little as 10% may be used in still other examples.

Figure 1:
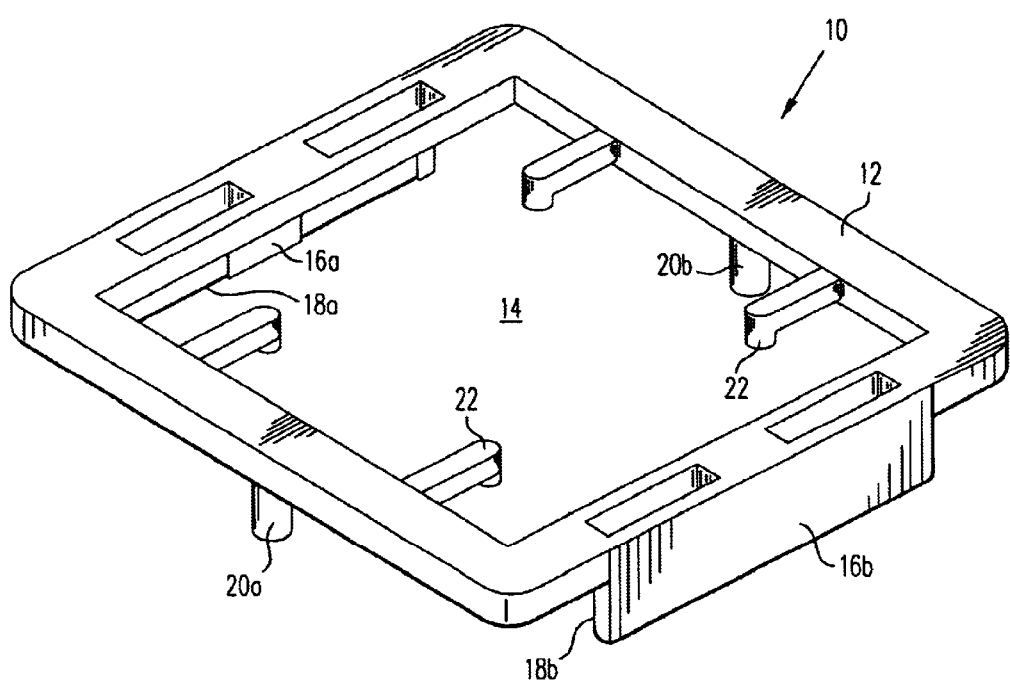
FIG. 1 illustrates a clip of the prior art.

Heat sink 30, which is designed to be combined with clip 10 (FIG. 1), has four cutouts 35a, 35b, 35c, and 35d on plate 32 through which side plates 16a and 16b (FIG. 1) and protruding rods 20a and 20b can be extended. Note that the word "cutout" is used synonymously with the word "hole" when describing the embodiment of FIG. 2, although in some embodiments (e.g. see FIG. 3) the cutouts can be made open (with the periphery of the heat sink).

Cutouts 35a–35d and flat portion 36, which together accommodate frame 12 (FIG. 1), separate protrusions 34 into peripheral protrusions 34a and inside protrusions 34b. Cutouts 35a and 35b are shown as slits having a generally rectangular shape configured to fit side plates 16a and 16b (FIG. 1), and cutouts 35c and 35d are shown as holes having a generally oval shape configured to fit protruding rods 20a and 20b. Cutouts 35a–35d are illustrative and non-limiting. For example, heat sink 30 may have a different number of cutouts on different parts of heat sink 30, possibly on more than one surface of plate 32. Plate 32 has protrusions 34 on at least one surface in one embodiment. Protrusions 34 may be, for example, cooling pins or cooling fins.

Figure 3:
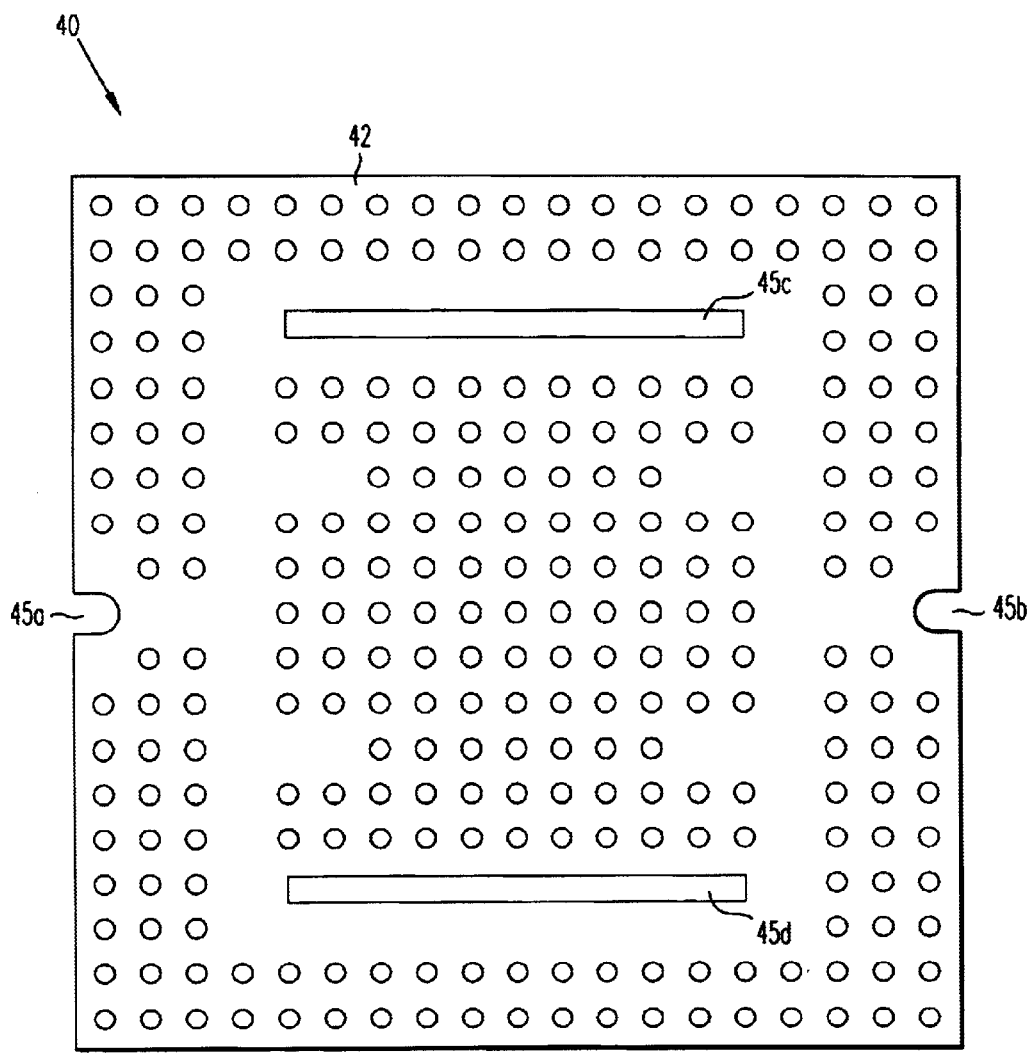
FIG. 3 illustrates a plan view of another heat sink that may be used in an alternative embodiment of the present invention.

As depicted in FIG. 3, a cutout may be located along the periphery of a heat sink surface. FIG. 3 depicts an exemplary heat sink 40 having cutout 45a and cutout 45b located along the outer boundaries of plate 42, thereby allowing cutout 35a and cutout 35b (FIG. 2) to be eliminated. Depending on the design, a heat sink may include any combination of peripheral cutouts 45a, 45b of FIG. 3, and/or inner cutouts 35a, 35b (also called "holes" or simply "cutouts") of FIG. 2. For example, heat sink 40 includes peripheral cutouts 45a and 45b and inner cutouts 45c and 45d.

Figure 4:
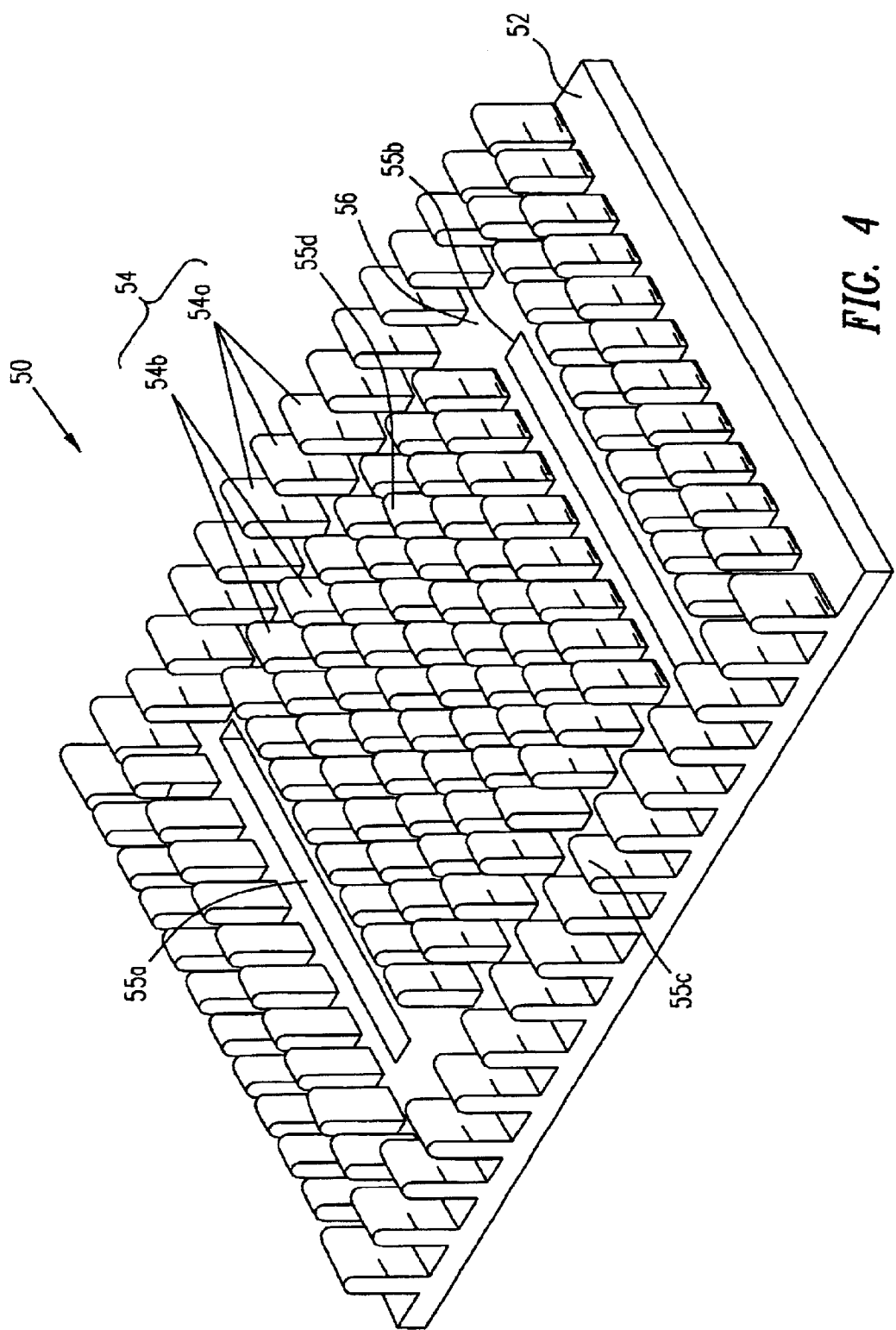
FIG. 4 illustrates a perspective view of another heat sink that may be used in another alternative embodiment of the present invention.

FIG. 4 depicts a perspective view of a heat sink 50 in accordance with another embodiment of the present invention. Heat sink 50 includes a plate 52, protrusions 54, and cutouts 55a–55d. Heat sink 50 is substantially similar to heat sink 30, one of the differences being the arrangement of the protrusions. Although protrusions 54 are arranged differently from protrusions 34, protrusions 54, like protrusions 34, are divided into peripheral protrusions 54a and inside protrusions 54b by cutouts 55a–55d and flat portion 56. In some systems, protrusions 54 may aid heat dissipation by increasing the surface area of heat sink 50 and thereby increase heat transfer efficiency. In an alternative embodiment, protrusions that are uniformly arranged may be spaced far enough apart that clip 10 fits in the space between adjacent protrusions without the need to omit protrusions as in flat portion 56.

Figure 5:
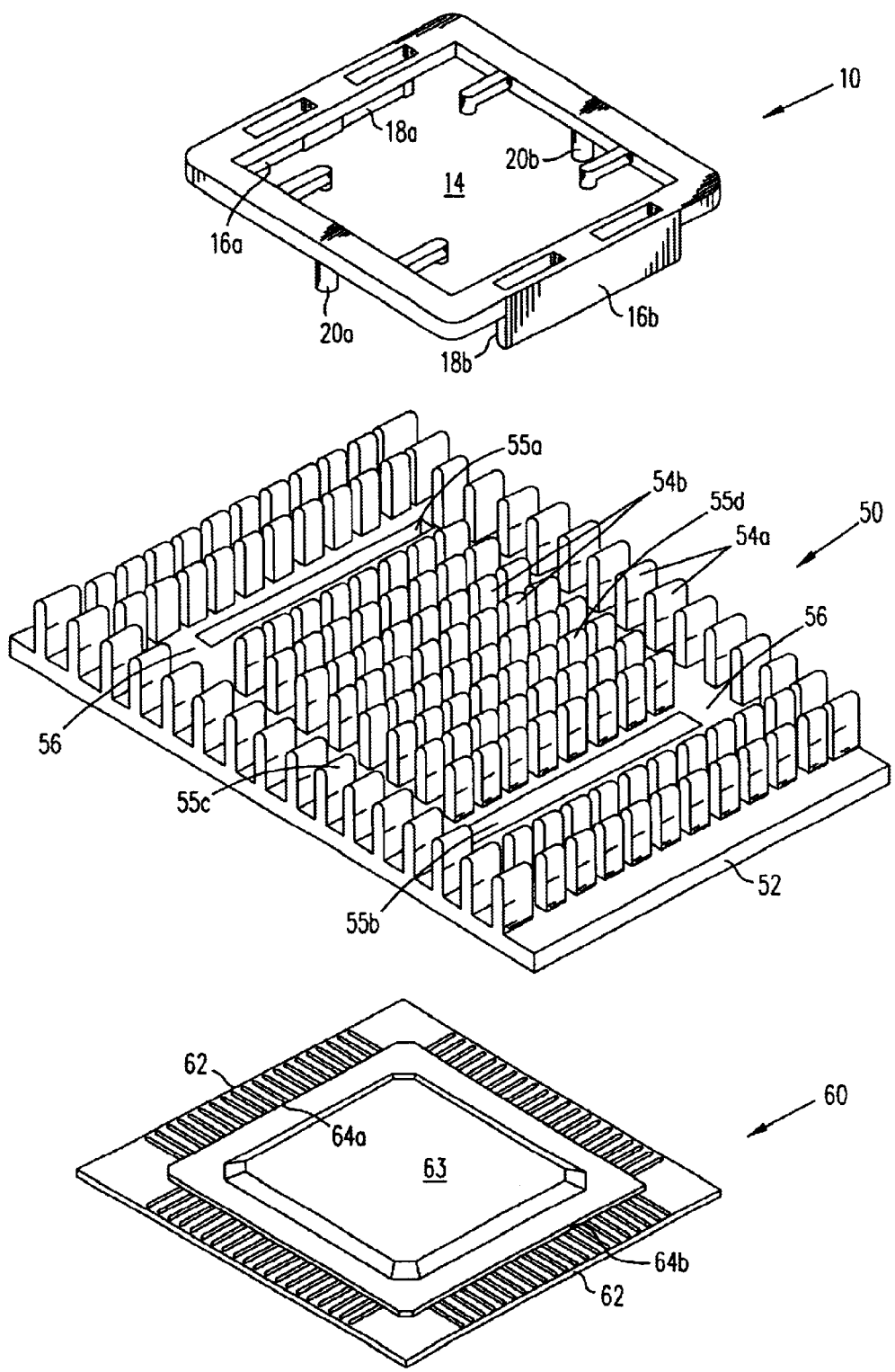
FIG. 5 illustrates a perspective view of an assembly of over-sized heat sink with an electronic component using a clip in accordance with an embodiment of the present invention.

FIG. 5 depicts assembling a heat sink device by using clip 10 to combine heat sink 50 with component 60, in accordance with an embodiment of the present invention. Inside protrusions 54b are inserted upwards through hole 14 of clip 10 until flat portion 56 on plate 52 comes in contact with clip 10. Clip 10 and heat sink 30 are designed so that insertion of inside protrusions 54b through hole 14 automatically results in downward extensions of side plates 16a and 16b and protruding rods 20a and 20b through cutouts 55a, 55b, 55c, and 55d, respectively. Component 60 is moved toward plate 52 (upward in FIG. 5) in a way that outer edges 64a and 64b of component 60 are aligned with cutouts 55a and 55b. Fastening hooks 18a and 18b on side plates 16a and 16b extend through cutouts 55a and 55b, press against outer edges 64a and 64b of component 60, and fasten component 60 to heat sink 50 by applying a pressure on the surface of metallic plate 63 (FIG. 6 shows the fastening mechanism). Metallic plate 63 may be part of a component on silicon 66. Silicon 66 may be attached to motherboard 62 by ball grid array (not shown). If clip 10 includes elastic rods 22, elastic rods 22 would be in contact with and pushing down on plate 52. When dissembling the heat sink device, clip 10 can be pulled to the side and/or upward so that it releases component 60 from the grip of fastening hooks 18a and 18b.

Figure 6A:
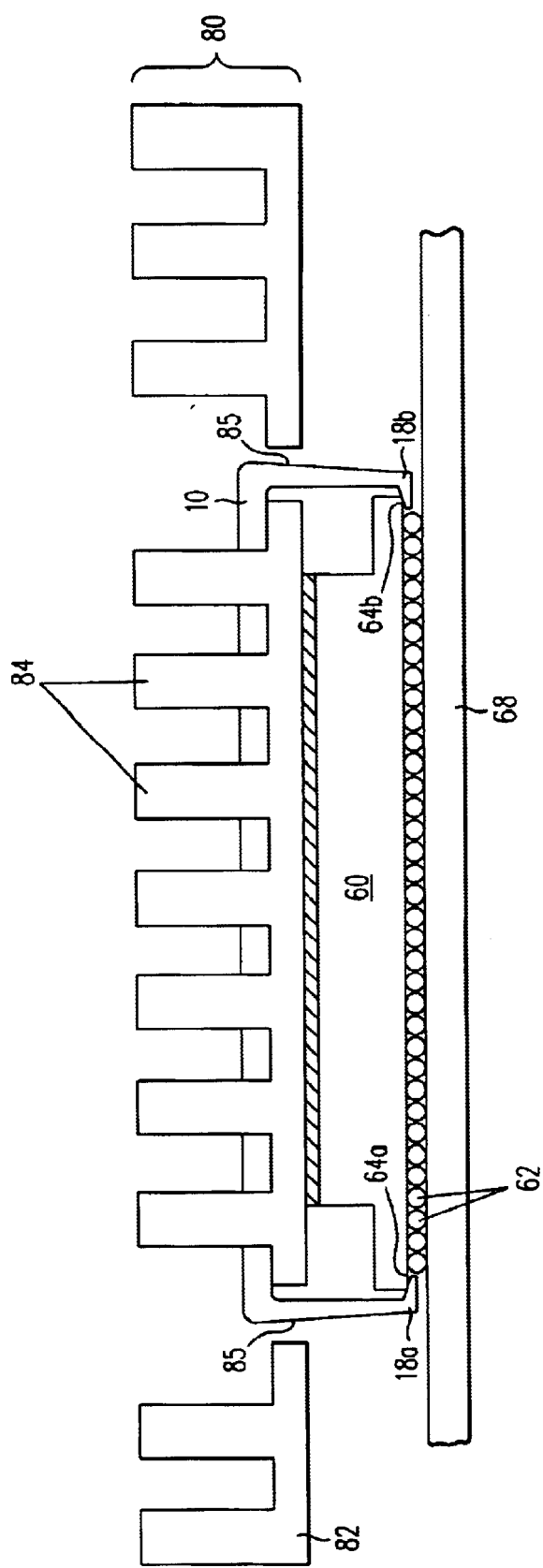
FIG. 6A illustrates a side view of a heat sink device, in accordance with one embodiment of the present invention.

FIG. 6A depicts a side view of a heat sink device, in accordance with one embodiment of the present invention. This heat sink device includes heat sink 80 fastened to component 60 by clip 10, wherein component 60 is attached to motherboard 68. Heat sink 80 includes plate 82, protrusions 84 protruding from plate 82, and cutouts 85 on plate 82. In one embodiment, component 60 is attached to motherboard 68 by Ball Grid Array 65. Ball Grid Array 65 attaches component 60 to motherboard 68 while creating a space between component 60 and motherboard 68. The space allows fastening hooks 18a and 18b to snap around bottom edges 64a and 64b of component 60 without straining component 60 or motherboard 68. A person of ordinary skill in the art would know of other ways to create the space between component 60 and the motherboard in order to allow fastening hooks 18a and 18b to snap on to a component, such as component 60.

Figure 6B:
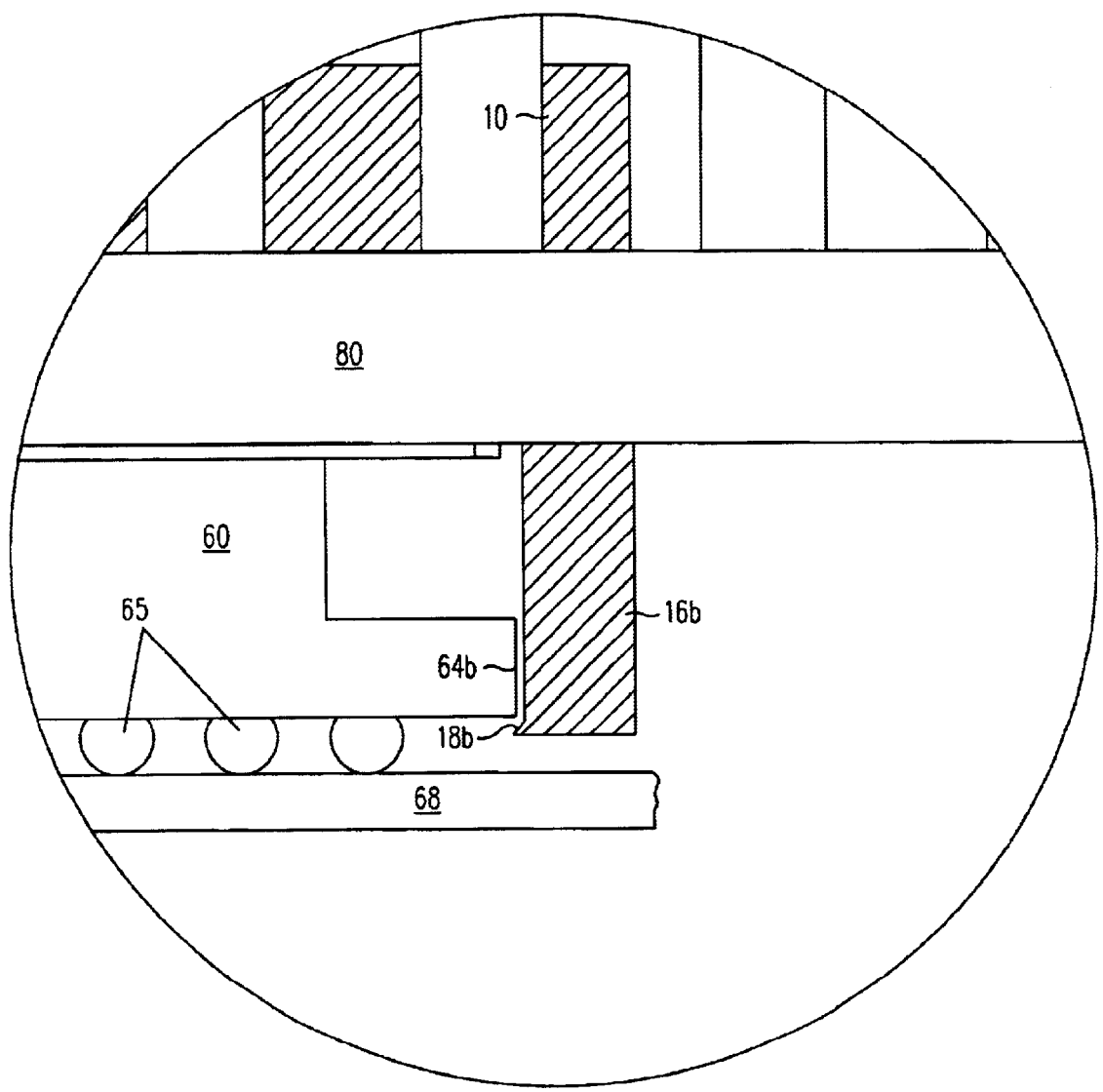
FIG. 6B illustrates in an enlarged side view a fastening mechanism for a heat sink device, in accordance with one embodiment of the present invention.

FIG. 6B depicts a fastening mechanism for a heat sink device, in accordance with one embodiment of the present invention. Heat sink 80 is fastened to component 60 by fastening hook 18b of clip 10 (shaded for clarity). A protruding portion of clip 10, such as side plate 16b, extends through a hole in heat sink 80. Fastening hook 18b wraps around edge 64 of component 60. Since component 60 is attached to motherboard 68 by Ball Grid Array 65, clip 10 does not need to fasten component 60 to motherboard 68. Motherboard 68 may or may not have a hole.

Figure 7A:
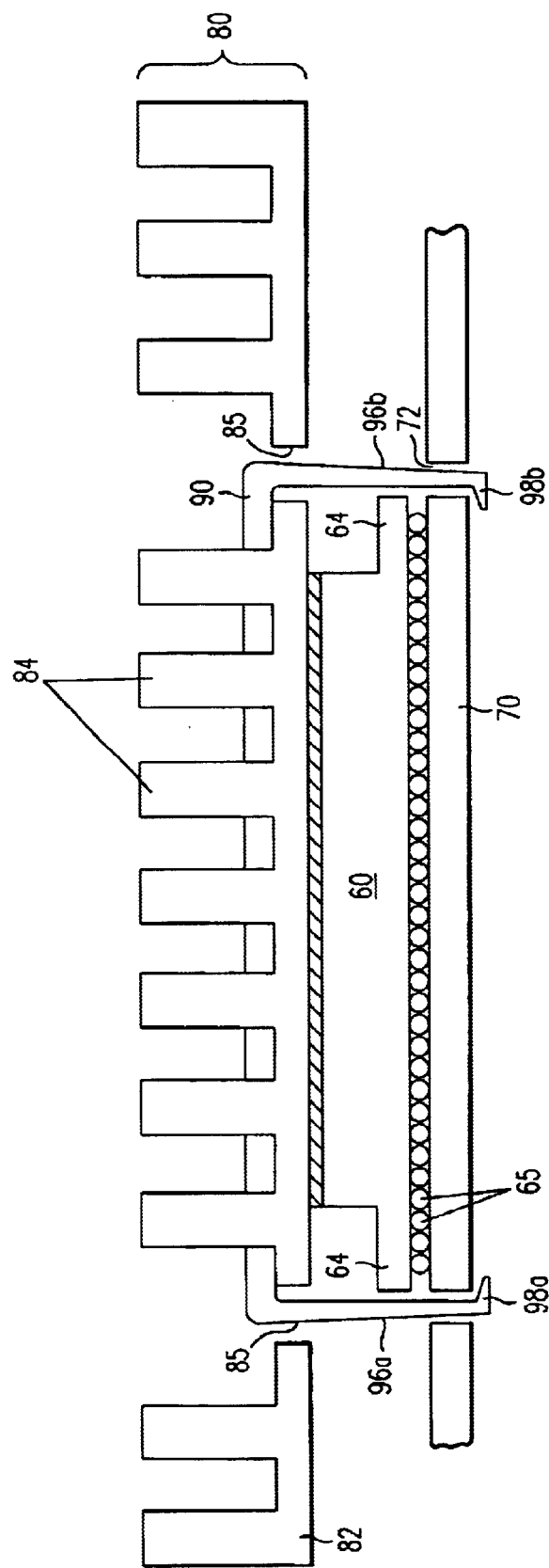
FIG. 7A illustrates a cross-sectional side view of a heat sink device mounted on a motherboard with a hole, in accordance with one embodiment of the present invention.

FIG. 7A depicts a side view of a heat sink device including a motherboard 70 with a hole, in accordance with another embodiment of the present invention. Like the embodiment of FIG. 6A, heat sink 80 is fastened to component 60 by a clip 90, which has side plates 96a and 96b connected to fastening hooks 98a and 98b, respectively. Clip 90 is similar to clip 10 (FIG. 1), except that side plates 96a and 96b are designed to extend through both cutouts 85 in a heat sink and cutouts 72 in motherboard 70. Unlike in the embodiment of FIG. 6A, motherboard 70 also contains cutouts so that side plates 96a and 96b extend through motherboard 70. Fastening hooks 98a and 98b at the ends of side plates 96a and 96b snap on to edges of cutouts 72 in motherboard 70. Component 60 is located between plate 82 of heat sink 80 and motherboard 70, and between side plate 86a and side plate 86b. The same heat sink 80 can be used for the embodiments in both FIG. 6A and FIG. 7A. Therefore, heat sink 80 can be used with a motherboard that does not have cutouts or a motherboard that has cutouts.

Figure 7B:
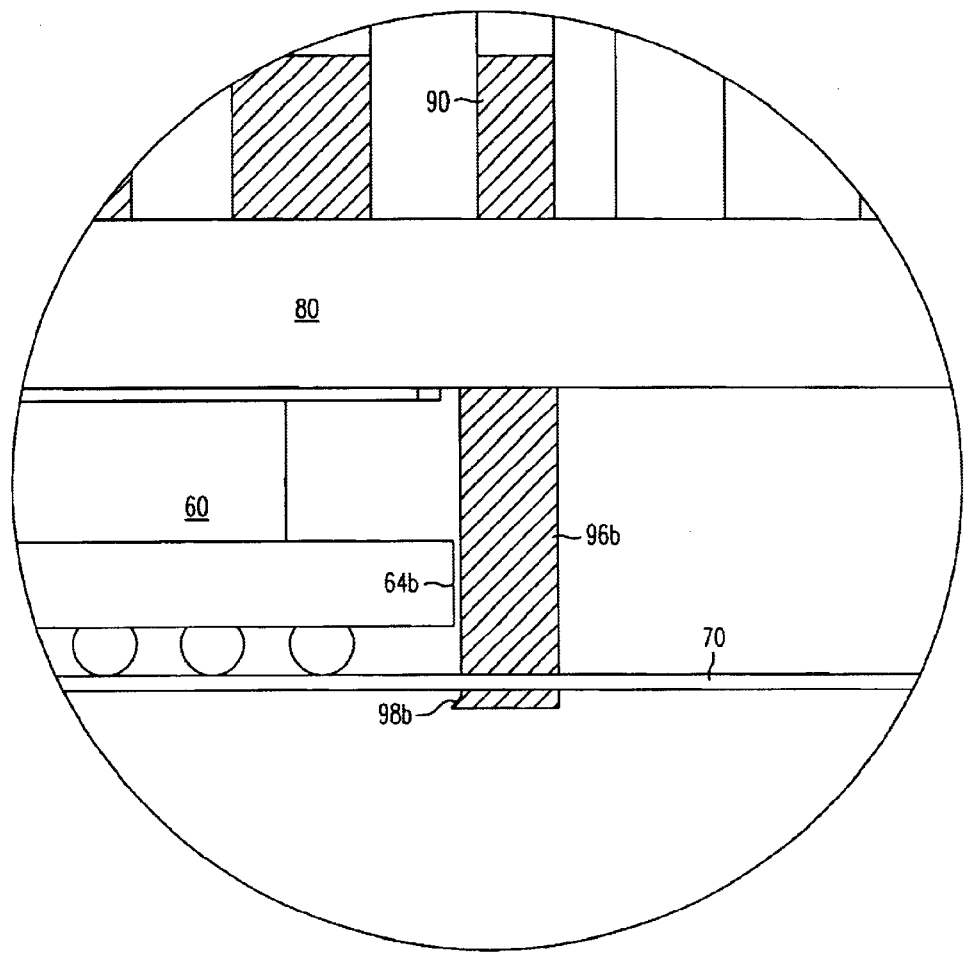
FIG. 7B illustrates in an enlarged side view a fastening mechanism for a heat sink device including a motherboard with a hole, in accordance with one embodiment of the present invention.

FIG. 7B depicts a fastening mechanism for a heat sink device including a motherboard with a hole, in accordance with one embodiment of the present invention. Heat sink 80 is fastened to component 60 by fastening hook 98b of clip 90 (shaded for clarity). Fastening hook 98b at an end of side plate 96b wraps around edge of a cutout in motherboard 70. A portion of clip 10, such as side plate 96b, extends through a cutout in heat sink 80 and a cutout in motherboard 70. Fastening hook 98b at an end of side plate 96b wraps around edge of a cutout in motherboard 70.

Figure 8:
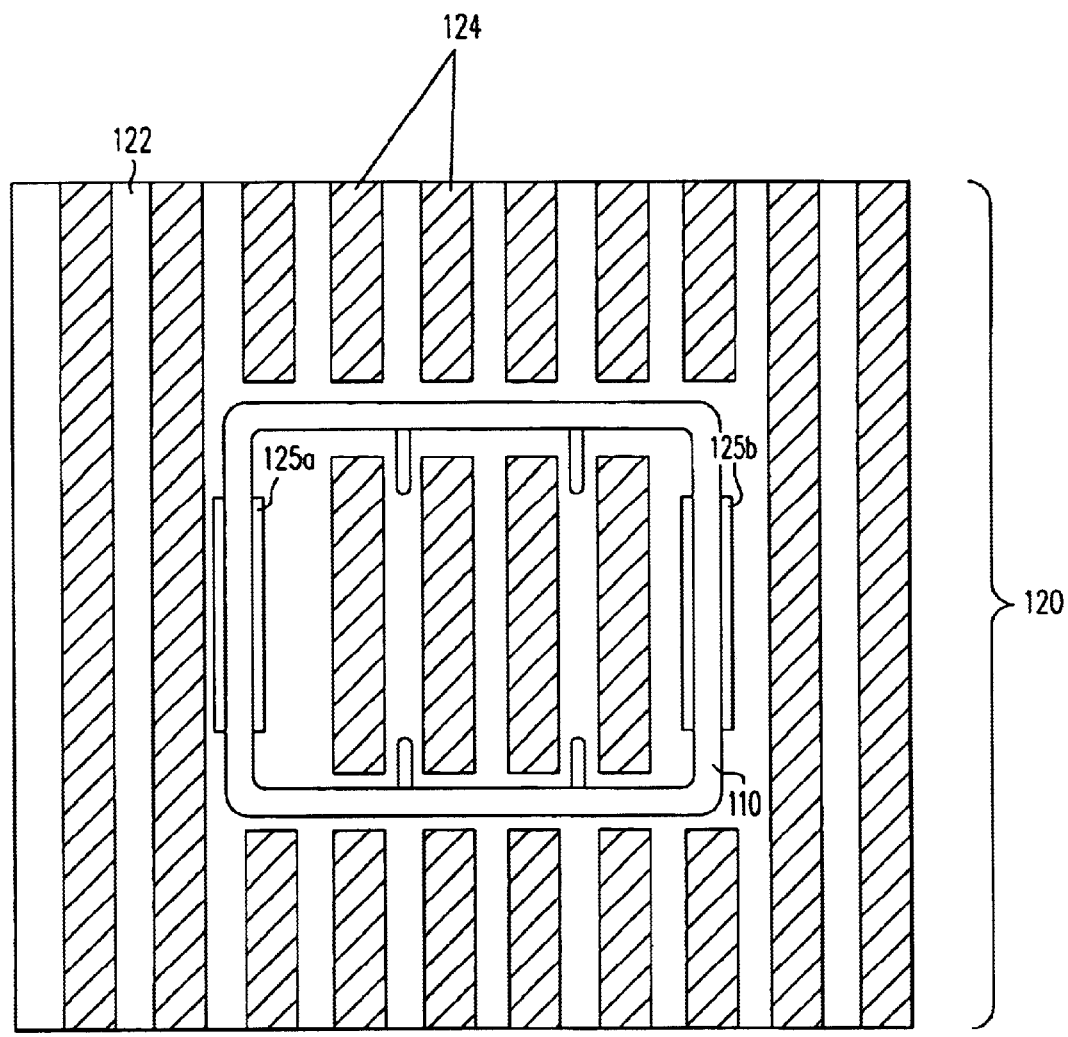
FIG. 8 illustrates a plan view of a heat sink device including a clip, in accordance with one embodiment of the present invention.

FIG. 8 depicts a plane view of a heat sink device assembled with a clip 110, in accordance with one embodiment of the present invention. Clip 110 attaches heat sink 120 to a component, which is not shown. Heat sink 120 includes a plate 122, protrusions 124 protruding from plate 122, and cutouts 125a and 125b. Clip 110 rests on a part of plate 122 that is free of protrusions. Protrusions 124 of heat sink 120 are substantially similar to protrusions 54 of FIG. 4, and may be cooling fins or cooling rods designed to increase the heat dissipation surface area. For simplicity, FIG. 8 shows protrusions 124 as protrusion clusters, indicated by shaded areas. Each protrusion cluster includes one or more protrusions 124. Clip 110 rests on plate 122 in such a way that protruding portions (not shown) of clip 110 extend through cutouts 125a and 125b and fasten a component against a surface of plate 122 that is not shown.

Figure 9:
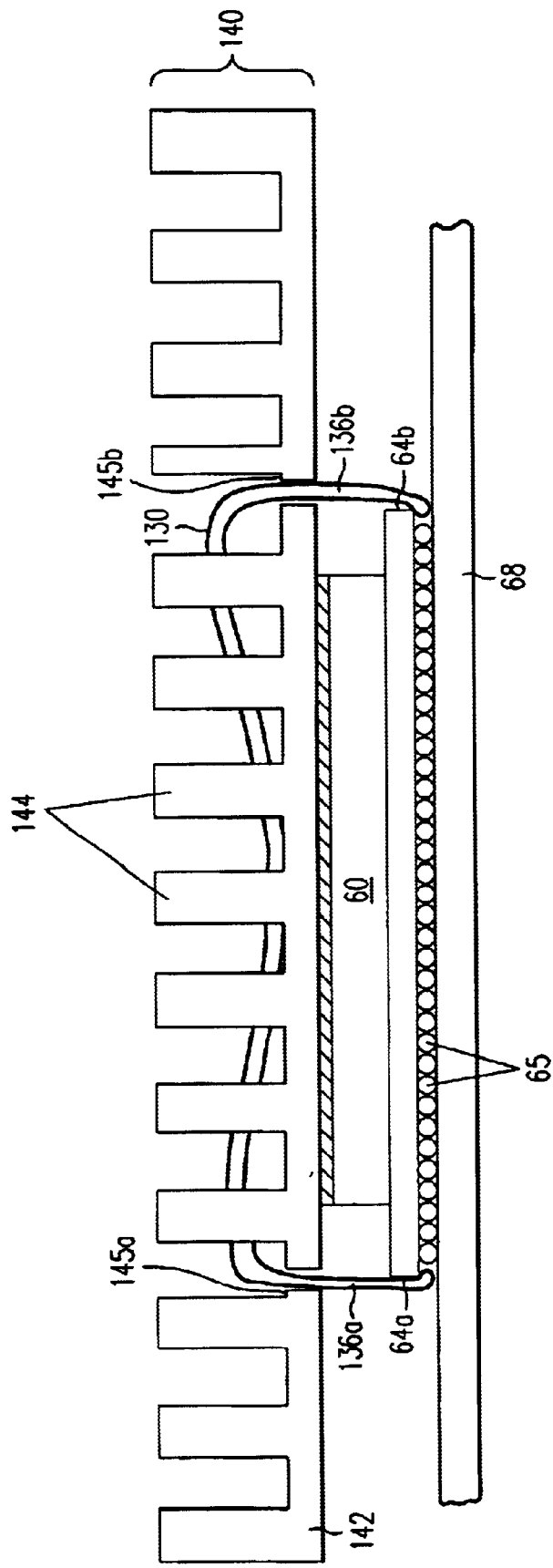
FIG. 9 illustrates a side view of a heat sink device including at least one metal clip, in accordance with one embodiment of the present invention.

FIG. 9 depicts a side view of a heat sink device assembled with at least one metal clip 130, in accordance with one embodiment of the present invention. Metal clip 130 may be, for example, any appropriate metal clip that is currently available in the market. Heat sink 140 may be substantially similar to heat sink 50 (FIG. 4), one of the differences being the arrangement of the surface protrusions 144. Like clip 10 of FIG. 6A, metal clip 130 rests on a part of plate 142 where there are no protrusions. Protruding portions 136a and 136b of metal clip 130 extend through cutouts 145a and 145b and snap around edges 64a and 64b of component 60, fastening component 60 against heat sink 140. In another embodiment including a motherboard with cutouts, protruding portions 136a and 136b of clip 130 may extend through the motherboard and snap around the edges of the cutouts in the motherboard, fastening heat sink 140 to the motherboard.

Figure 10:
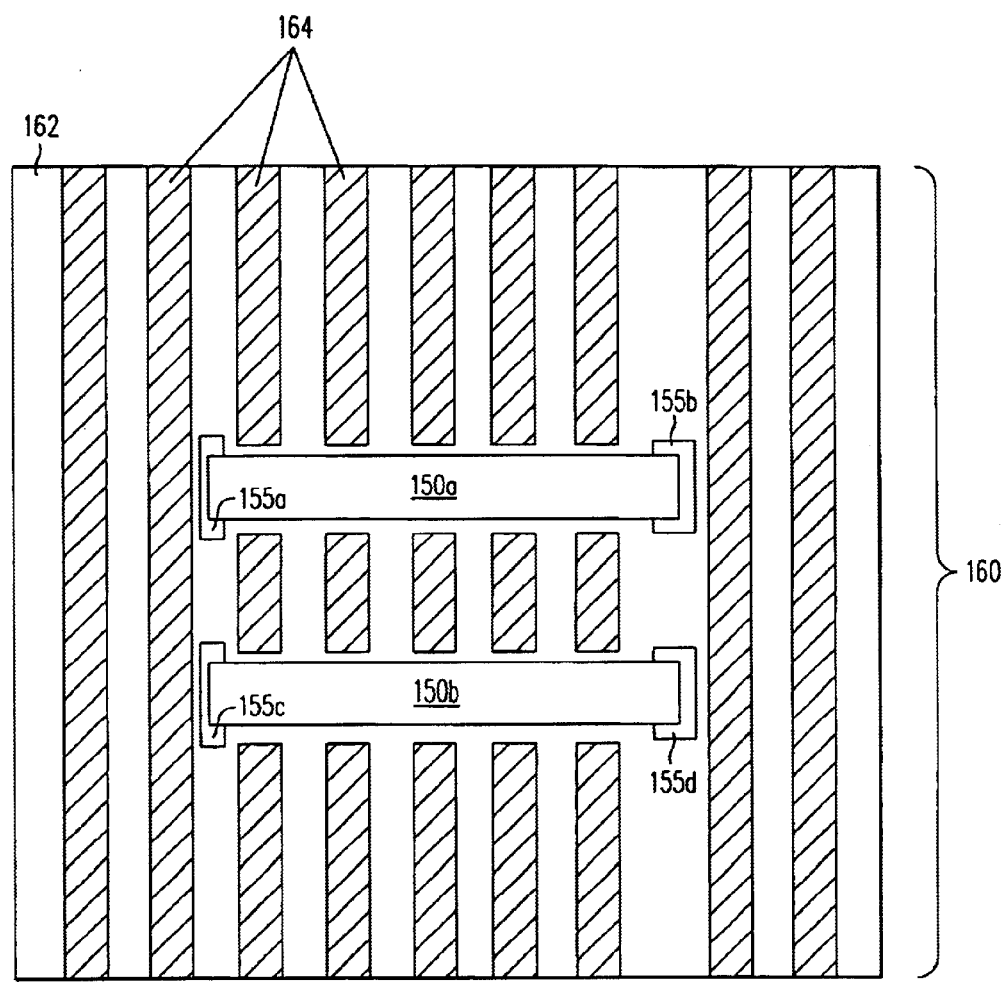
FIG. 10 illustrates a plan view of a heat sink device including at least one metal clip, in accordance with one embodiment of the present invention.

FIG. 10 depicts a plane view of a heat sink device assembled with at least one metal clip 150, in accordance with one embodiment of the present invention. Metal clip 150 fastens heat sink 160 to a component (not shown) or a motherboard (not shown). Heat sink 160 includes a plate 162 and protrusions 164 protruding from plate 162. The embodiment in FIG. 10 includes two metal clips, metal clip 150a and metal clip 150b, resting on a part of plate 162 free of protrusions 164. Protruding portions of metal clip 150a and metal clip 150b extend through cutouts 155a, 155b, 155c, and 155d on plate 152. For simplicity, protrusions 154 are shown as protrusion clusters indicated by shaded areas. Each protrusion cluster includes one or more protrusions 154, which maybe cooling fins or cooling rods.

Figure 11:
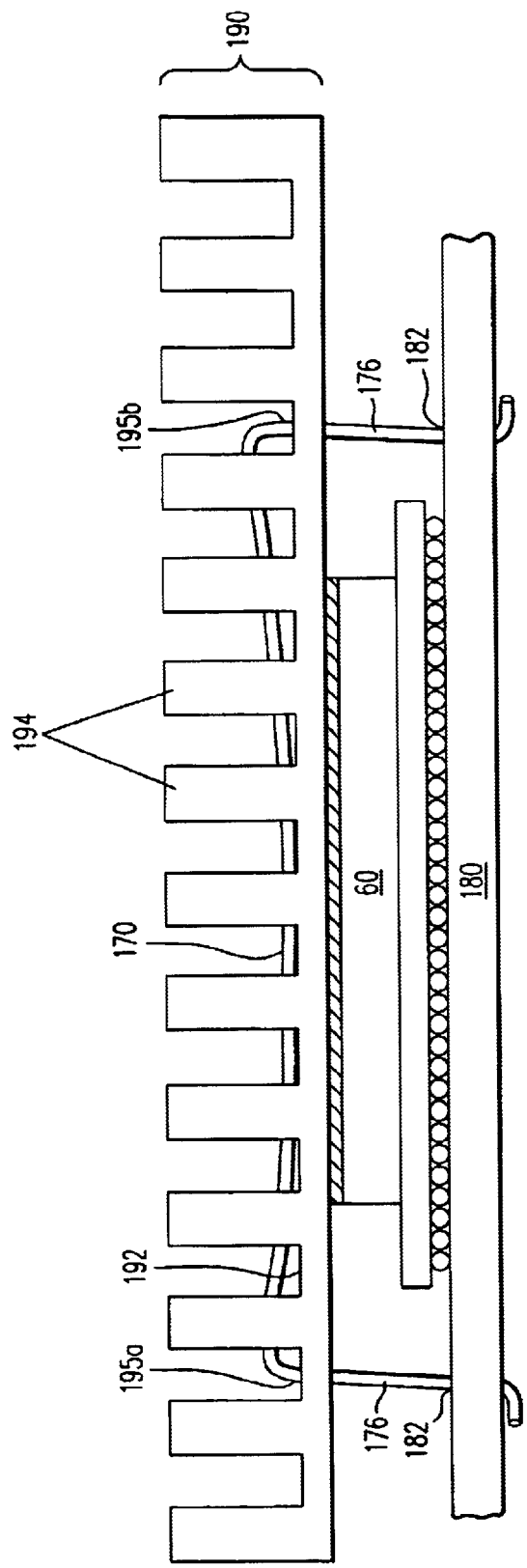
FIG. 11 illustrates a side view of a heat sink device including at least one wire spring, in accordance with one embodiment of the present invention.

FIG. 11 depicts a side view of a heat sink device assembled with at least one wire spring 170 and a motherboard 180 with cutouts 182, in accordance with another embodiment of the present invention. Wire spring 170 may be any appropriate wire spring currently available in the market. Wire spring 170 fastens heat sink 190 to motherboard 180, pressing component 60 between heat sink 190 and motherboard 180. Heat sink 190 includes a plate 192, protrusions 194, and cutouts 195. Wire spring 170 rests on surface 192 of heat sink 190 and extend protruding portions 176 through cutouts 195. Protruding portions 176 extend through cutouts 182 in motherboard 180 and snaps around edges of cutouts 182 to fasten heat sink 190 to motherboard 180. Wire spring 170 does not have to contact component 60.

Figure 12:
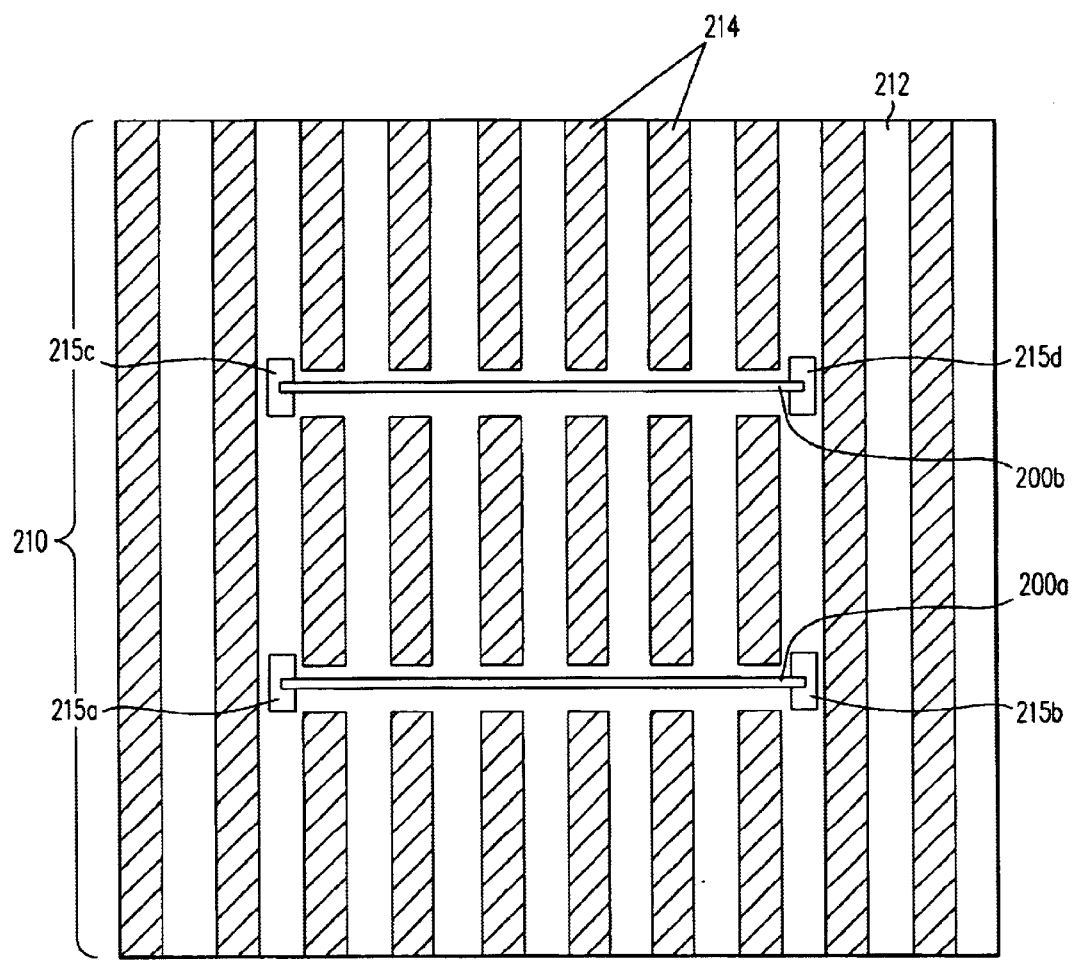
FIG. 12 illustrates a plan view of a heat sink device including at least one wire spring, in accordance with one embodiment of the present invention.

FIG. 12 depicts a plane view of a heat sink device assembled with at least one wire spring 200, in accordance with one embodiment of the present invention. The embodiment in FIG. 12 includes wire spring 200a, wire spring 200b, and heat sink 210 including a plate 212, protrusions 214 substantially similar to protrusions 54 of FIG. 4, and cutouts 215a, 215b, 215c, and 215d on plate 212. Wire spring 200a and wire spring 200b rest on parts of plate 212 free of protrusions 214 and extend through cutouts 215a, 215b, 215c, and 215d of heat sink 210. For simplicity, FIG. 12 shows protrusions 214 as shaded areas of protrusion clusters, each of which includes one or more protrusions such as cooling fins or cooling rods.

Figure 13:
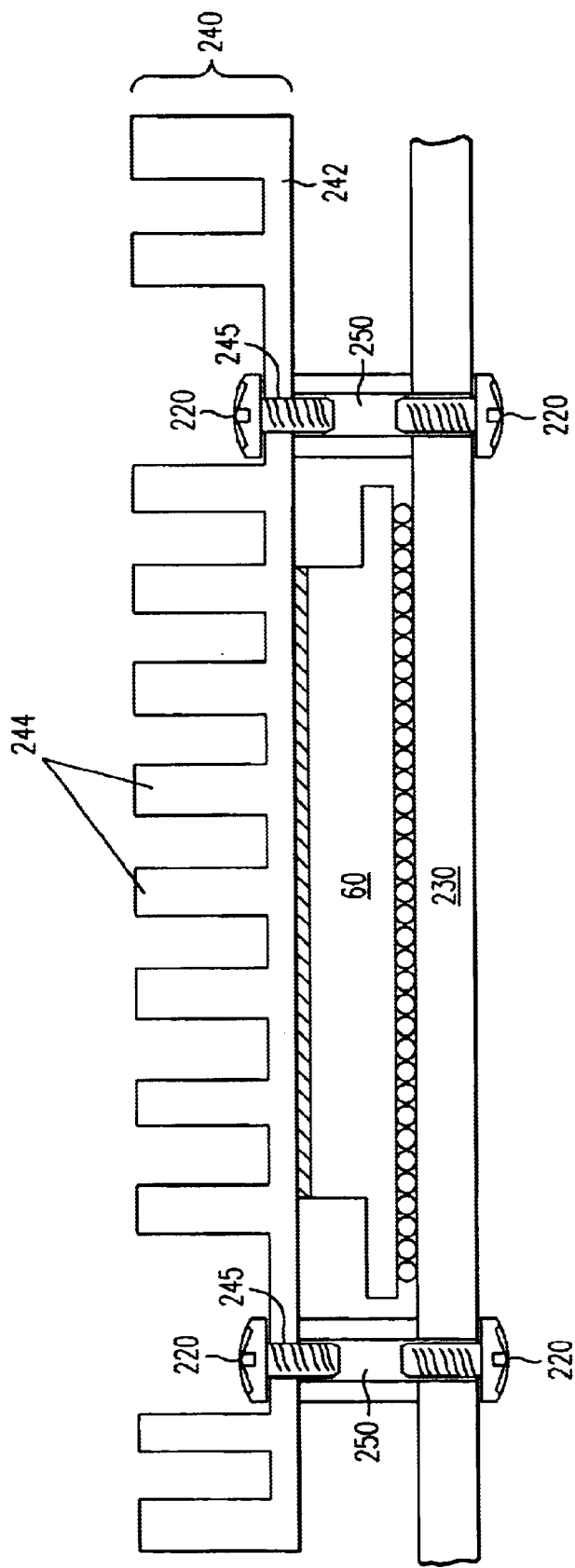
FIG. 13 illustrates a side view of a heat sink device including at least one screw, in accordance with one embodiment of the present invention.

FIG. 13 depicts a side view of a heat sink device including at least one screw 220 and a motherboard 230 that has holes, in accordance with one embodiment of the present invention. Screw 220 attaches a heat sink 240 to motherboard 230, sandwiching component 60 between heat sink 240 and motherboard 230. Screw 220 may be, for example, an appropriate screw currently available in the market. Heat sink 240 includes a plate 242, protrusions 244 that are substantially similar to protrusions 54 (FIG. 4), and cutouts 245. Screw 220 may be inserted into a threaded standoff 250 between heat sink 240 and motherboard 230. A longer screw 220 may also be inserted through the holes in the motherboard and the heatsink. Optionally, a nut may be used. There may be threads in heat sink 240. In some embodiments, the threads may be in the motherboard.

Figure 14:
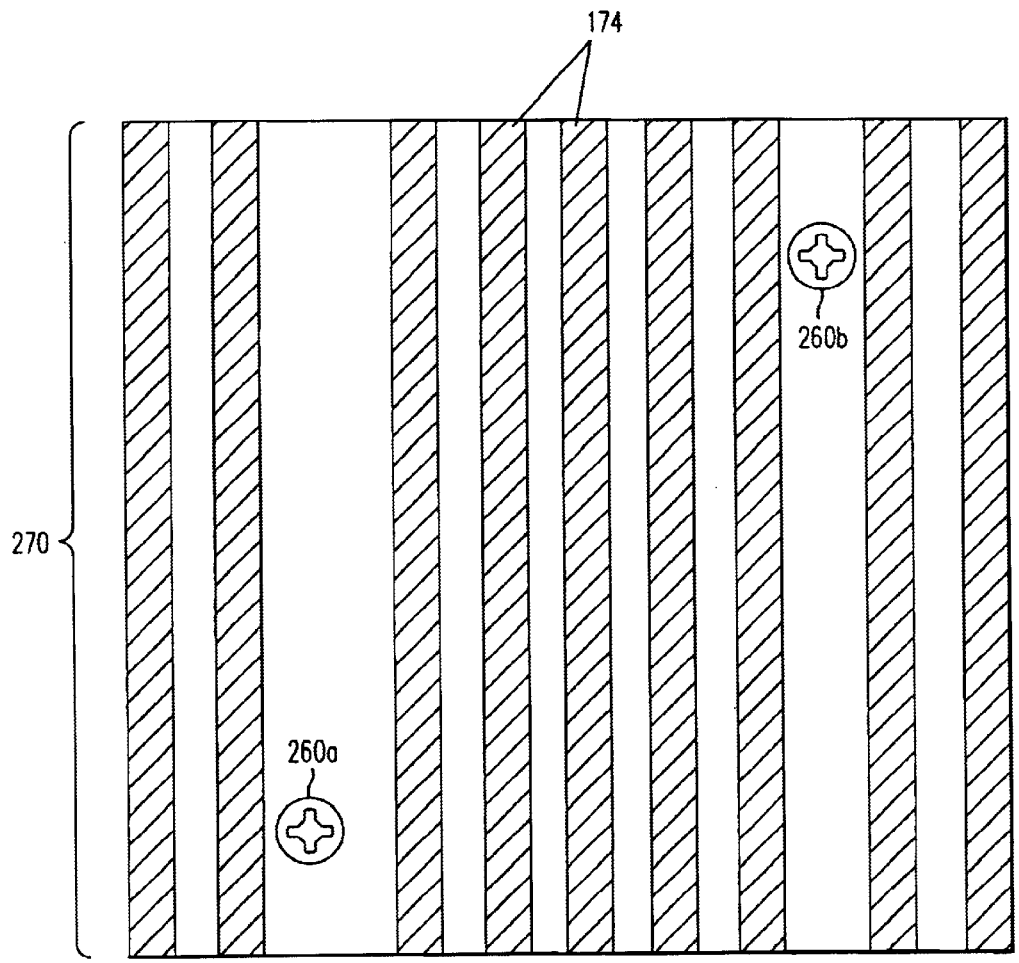
FIG. 14 illustrates a plan view of a heat sink device including a at least one screw, in accordance with one embodiment of the present invention.

FIG. 14 depicts a plane view of a heat sink device assembled with a screw 260, in accordance with one embodiment of the present invention. For example, the embodiment in FIG. 14 could be a view from the top of the embodiment depicted in FIG. 13. The embodiment in FIG. 14 includes two screws, screw 260a and screw 260b, resting on a flat portion of heat sink 270 that is free of the protrusions 274. For simplicity, protrusions 274 are shown as shaded areas. Protrusions include cooling fins or cooling rods.

While particular examples of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A device comprising:
   a component;
   a heat sink attached to the component, the heat sink having at least one cutout and having an overhang on all sides of the component; and
   a clip in contact with the component and the heat sink, the clip having a polygonal frame and a portion that extends through the at least one cutout, the portion of the clip attaching the component to the heat sink;
   wherein:
   the component has four sides;
   the polygonal frame also four sides; and
   each side of the polygonal frame is substantially parallel to a corresponding side of the component.

2. A device comprising:
   a component;
   a heat sink attached to the component, the heat sink having at least one cutout and having an overhang on all sides of the component; and
   a clip in contact with the component and the heat sink, the clip having a polygonal frame and a portion that extends through the at least one cutout, the portion of the clip attaching the component to the heat sink;
   wherein:
   the heat sink has a lower surface attached to the component;
   the heat sink has an upper surface opposite to the lower surface; and
   the heat sink comprises a plurality of protrusions located on the upper surface.

3. The device of claim 2 wherein:
   a group of said protrusions are located in a central region of the upper surface of the heat sink;
   the remainder of said protrusions are located in an outer region of the heat sink that is separated from the central region by an inner region of the heat sink; and
   the inner region of the heat sink is devoid of protrusions.

4. The device of claim 3 wherein:
   the polygonal frame of the clip has a lower surface in contact with the upper surface of the heat sink in the inner region.

5. The device of claim 3 wherein:
   the polygonal frame has four sides;
   the inner region of the heat sink also has four sides; and
   each side of the polygonal frame is in contact with a corresponding side of the inner region.

6. The device of claim 5 wherein:
   the polygonal frame has an upper surface opposite to the lower surface of the polygonal frame; and
   a thickness of the polygonal frame between the upper surface and the lower surface thereof is smaller than a height of a protrusion in said plurality of protrusions.

7. The device of claim 3 wherein:
   said "at least one cutout" is a round hole located in the inner region of the heat sink; and
   the clip has a rod with a round cross section that passes through the round hole.

8. The device of claim 7 wherein:
   the heat sink has a plurality of additional holes also located in the inner region; and
   the clip has a plurality of additional members that pass through the additional holes in the heat sink.

9. The device of claim 3 wherein:
   among the remainder of said protrusions located in the outer region of the heat sink, there are at least two rows on at least one side of the heat sink.

10. The device of claim 9 wherein:
    there are at least two rows on all sides of the heat sink, including said at least one side.

11. The device of claim 9 wherein:
    at least one of the protrusions in the at least two rows is a cooling fin.

12. The device of claim 9 wherein:
    at least one of the protrusions in the at least two rows is a cooling pin.

13. The device of claim 2 wherein:
    the polygonal frame of the clip has an upper surface that is exposed;
    the polygonal frame has a lower surface that is opposite to the exposed upper surface;
    the lower surface of the polygonal frame is in contact with a first region on the upper surface of the heat sink;
    the polygonal frame surrounds a group of said protrusions located in a central region of the upper surface of the heat sink; and
    the component has an upper surface that is attached to a central region of a lower surface of the heat sink.

14. The device of claim 3 wherein:
    the inner region is rectangular.

15. The device of claim 13 wherein:
    the first region is rectangular.

16. A device comprising:
    a component;
    a heat sink attached to the component, the heat sink having an overhang on all sides of the component, the heat sink comprising a plurality of protrusions located on an upper surface thereof; and
    a clip in contact with the component and the heat sink, the clip having a portion that extends through an opening in the heat sink, the portion of the clip attaching a lower surface of the heat sink to the component;
    wherein the lower surface of the heat sink is separated from the upper surface of the heat sink by a distance equal to the thickness of the heat sink;
    the device further comprising:
    a group of said protrusions are located in a central region of the upper surface of the heat sink;

the remainder of said protrusions are located in an outer region of the heat sink that is separated from the central region by an inner region of the heat sink;

the inner region of the heat sink is devoid of protrusions; and the clip rests in the inner region and surrounds the group of said protrusions located in the central region of the heat sink.

17. The device of claim 16 wherein:

among the remainder of said protrusions located in the outer region of the heat sink, there are at least two rows on at least one side of the heat sink, and at least one of the protrusions is either a cooling fin or a cooling pin.

18. The device of claim 16 wherein:

the inner region is rectangular.

19. A device comprising:

a component;

a heat sink attached to the component, the heat sink having an overhang on all sides of the component, the heat sink comprising a plurality of protrusions located on an upper surface thereof; and a clip in contact with the component and the heat sink, the clip having a portion that extends through an opening in the heat sink, the portion of the clip attaching a lower surface of the heat sink to the component;

wherein the lower surface of the heat sink is separated from the upper surface of the heat sink by a distance equal to the thickness of the heat sink;

the device further comprising:

said opening is a round hole located in a region of the heat sink free of said protrusions; and the clip has a rod with a round cross section that passes through the round hole.

20. The device of claim 19 wherein:

the heat sink has a plurality of additional holes also located in said region; and the clip has a plurality of additional members that pass through the additional holes in the heat sink.

21. The device of claim 19 wherein:

the inner region is rectangular.

22. A device comprising:

a component;

a heat sink attached to the component, the heat sink having at least one feature selected from a group consisting of opening and cutout and having an overhang on all sides of the component, the heat sink comprising a group of protrusions located in a central region of the heat sink; and a clip comprising a polygonal frame that surrounds the group of protrusions on all sides, the clip further comprising a portion that extends through the feature in the heat sink, the portion of the clip attaching the component to the heat sink.

23. The device of claim 22 wherein:

additional protrusions are located in an outer region of the heat sink separated from said group of protrusions by an inner region of the heat sink; and the inner annular region of the heat sink is devoid of protrusions.

24. The device of claim 23 wherein:

the polygonal frame of the clip has a lower surface in contact with the upper surface of the heat sink in the inner region.

25. The device of claim 23 wherein:

the polygonal frame has four sides;

the inner region of the heat sink also has four sides; and each side of the polygonal frame is in contact with a corresponding side of the inner region.

26. The device of claim 25 wherein:

the polygonal frame has an upper surface opposite to the lower surface of the polygonal frame; and a thickness of the polygonal frame between the upper surface and the lower surface thereof is smaller than a height of a protrusion.

27. The device of claim 23 wherein:

said feature is a round hole located in the inner region of the heat sink; and the clip has a rod with a round cross section that passes through the round hole.

28. The device of claim 27 wherein:

the heat sink has a plurality of additional holes also located in the inner region; and the clip has a plurality of additional members that pass through the additional holes in the heat sink.

29. The device of claim 23 wherein:

the additional protrusions form two rows on all sides of the heat sink, and each protrusion is either a fin or a pin.

30. The device of claim 22 wherein:

the polygonal frame of the clip has an upper surface that is exposed;

the polygonal frame has a lower surface that is opposite to the exposed upper surface;

the lower surface of the polygonal frame is in contact with a first region on the upper surface of the heat sink; and the component has an upper surface that is attached to a central region of a lower surface of the heat sink.

31. The device of claim 23 wherein:

the inner region is rectangular.

32. A device comprising:

a component;

a heat sink attached to the component, the heat sink having at least one opening and having an overhang on all sides of the component;

a clip having a portion that extends through the opening in the heat sink, the portion of the dip attaching the heat sink to the component;

wherein the heat sink has at least a group of protrusions, the group being surrounded on all sides by the clip; and the heat sink has additional protrusions that together surround the clip.

33. The device of claim 32 wherein:

the additional protrusions form two rows on all sides of the heat sink, and each protrusion is either a fin or a pin.

34. The device of claim 32 wherein:

the heat sink has a plurality of additional holes located between the group of protrusions and the additional protrusions; and the clip has a plurality of additional members that pass through the additional holes in the heat sink.

35. The device of claim 32 wherein:

the clip comprises a rectangular frame.

* * * * *